United States Patent
Tanaka et al.

(10) Patent No.: US 6,521,046 B2
(45) Date of Patent: Feb. 18, 2003

(54) CHAMBER MATERIAL MADE OF AL ALLOY AND HEATER BLOCK

(75) Inventors: Toshiyuki Tanaka, Kobe (JP); Koji Wada, Kobe (JP); Jun Hisamoto, Kobe (JP); Hiroki Sawada, Mie (JP); Hiroshi Matsuura, Mie (JP)

(73) Assignee: Kabushiki Kaisha Kobe Seiko Sho, Kobe (JP)

( * ) Notice: Subject to any disclaimer, the term of this patent is extended or adjusted under 35 U.S.C. 154(b) by 65 days.

(21) Appl. No.: 09/773,638

(22) Filed: Feb. 2, 2001

(65) Prior Publication Data

US 2001/0019777 A1 Sep. 6, 2001

(30) Foreign Application Priority Data

Feb. 4, 2000 (JP) ........................ 2000-026881
Feb. 4, 2000 (JP) ........................ 2000-026892

(51) Int. Cl.⁷ .................... C23C 16/00; H05H 1/00
(52) U.S. Cl. .................... 118/715; 118/728; 118/725; 156/345.52; 156/345.51
(58) Field of Search .................... 118/725, 728, 118/724, 715; 156/345.52, 345.51

(56) References Cited

U.S. PATENT DOCUMENTS

| | | | | |
|---|---|---|---|---|
| 3,974,055 A | * | 8/1976 | Reding et al. | 204/196.22 |
| 4,717,068 A | * | 1/1988 | Meyer | 228/203 |
| 6,027,629 A | | 2/2000 | Hisamoto et al. | |
| 6,066,392 A | | 5/2000 | Hisamoto et al. | |
| 6,146,477 A | * | 11/2000 | Clark et al. | 148/539 |
| 6,159,301 A | * | 12/2000 | Sato et al. | 118/728 |
| 6,225,601 B1 | * | 5/2001 | Beer et al. | 219/390 |
| 6,267,922 B1 | * | 7/2001 | Bull et al. | 420/534 |

FOREIGN PATENT DOCUMENTS

| | | | | |
|---|---|---|---|---|
| JP | 3-72098 | 3/1991 | | |
| JP | 6-25808 | 2/1994 | | |
| JP | 7-180091 | 7/1995 | | |
| JP | 8-144089 | 6/1996 | | |
| JP | 9-31616 A | * 2/1997 | | C22F/1/05 |
| JP | 10-88271 | 4/1998 | | |
| JP | 11-1797 | 1/1999 | | |
| JP | 11-229185 | 8/1999 | | |
| JP | 2000-119896 | 4/2000 | | |
| JP | 2000-178790 | 6/2000 | | |

* cited by examiner

Primary Examiner—Gregory Mills
Assistant Examiner—P. Hassanzadeh
(74) Attorney, Agent, or Firm—Oblon, Spivak, McClelland, Maier & Neustadt, P.C.

(57) ABSTRACT

A chamber material made of Al alloy excellent in thermal cracking resistance and chemical and/or physical corrosion resistance and capable of reducing contamination excellently and further having excellent and wide applicable brazing property in a high temperature corrosive circumstance, in which the substrate aluminum material for the chamber material made of Al alloy having an anodized film comprises 0.1 to 2.0% Si, 0.1 to 3.5% Mg, 0.02 to 4.0% Cu on the mass% basis and the balance of Al and impurity element with Cr in the impurity elements being less than 0.04%. Preferably, Fe is 0.1% or less and Mn is 0.04% or less in the impurity element and, further, the total sum of impurity elements other than Cr and Mn being restricted to 0.1% or less. This invention can be utilized suitably to various materials used in high temperature corrosive circumstance, particularly, in high temperature corrosive gas or plasma atmosphere.

13 Claims, 1 Drawing Sheet

CHAMBER MATERIAL MADE OF AL ALLOY AND HEATER BLOCK

BACKGROUND OF THE INVENTION

1. Field of the Invention

Figure 1:
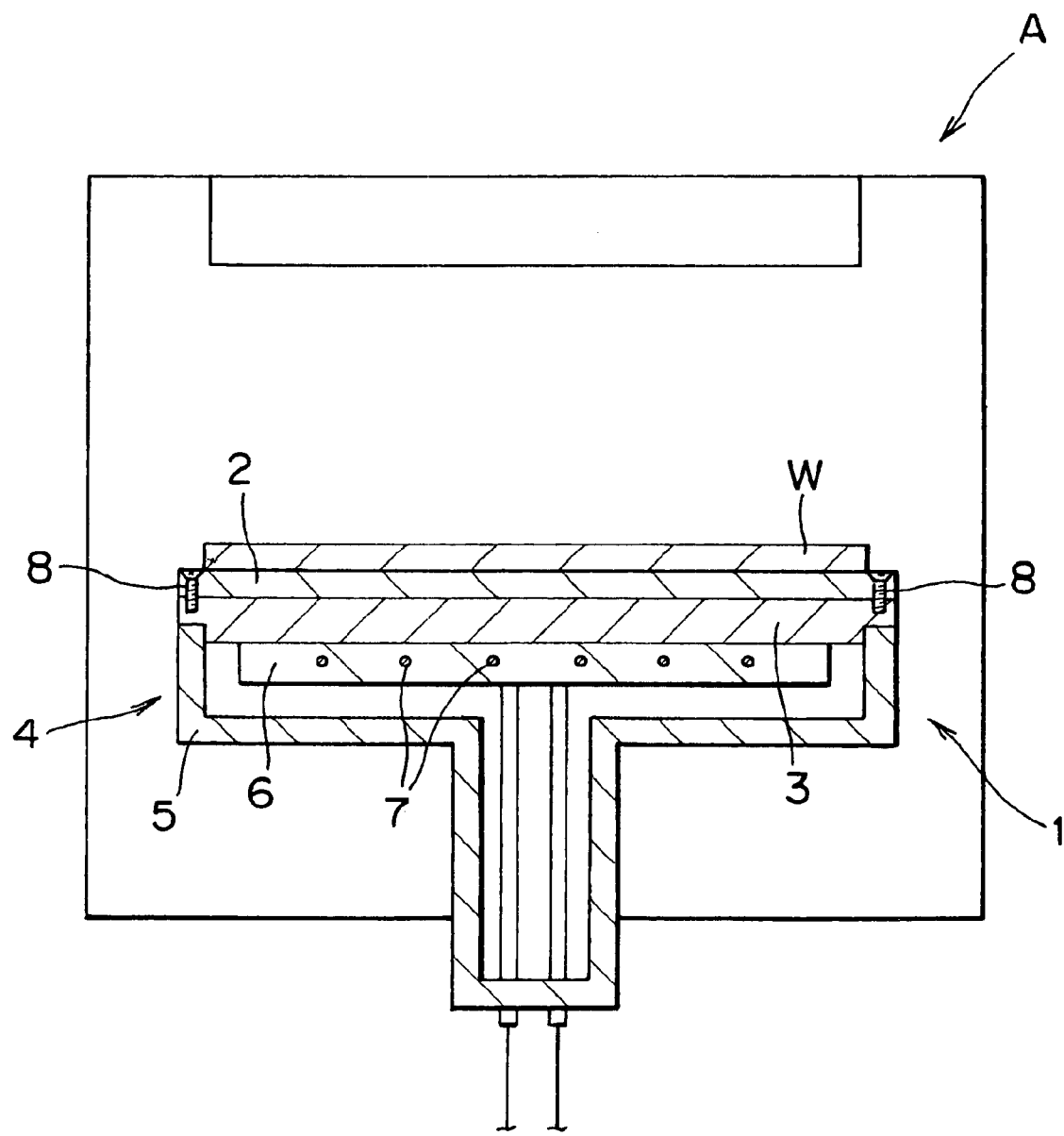

This invention concerns a chamber material made of alloy which is used suitably to various application uses requiring thermal cracking resistance and chemical and/or physical corrosion resistance in a plasma and/or an elevated temperature corrosive circumstance, for example, vacuum chambers, used in plasma processing apparatus such as production facilities for semiconductors and liquid crystals display panel, as well as components disposed in the inside of the chamber.

2. Statement of the Relevant Art

For vacuum chambers made of Al alloy used for plasma processing apparatus in production facilities for semiconductors and liquid crystals display panel, as well as various kinds of components such as electrodes disposed in the chamber, those materials comprising mainly Al—Mg series alloy (JIS A 5000 series) and Al—Mg—Si series alloy (JIS A 6000 series) as substrate with or without applying anodization have been used so far.

Anodization of forming anodized film on the surf ace of Al alloy substrates thereby providing the substrates with corrosion resistance and wear resistance has been generally adopted so far. In the inside of vacuum chambers, since predetermined processings are applied by various kinds of corrosive gases and plasmas or active species obtained by conversion into plasmas under circumstances from room temperature to elevated temperature of 200° C. or higher to materials to be processed such as silicon wafers during pre-treatment steps and production steps for semiconductors, the inner surfaces of the vacuum chambers and various components such as plasma electrodes disposed the inside of the vacuum chamber are exposed to the atmospheres described above, so that anodization is applied on the Al alloy substrates, particularly, for those components exposed in the plasmas to form anodized film on the surfaces thereof in order to maintain the corrosion resistance and the wear resistance.

The vacuum chambers made of Al alloys and various kinds of components such as electrodes disposed therein are required for corrosion resistance and wearing resistance, and there are further such components requiring brazing property such as for heater blocks. Al—Mg series alloys (JIS A 5000 series) have been used generally for the surface of the heater blocks and the block main body with a view point of forgeability and corrosion resistance.

Along with technical development in recent years, higher corrosion resistance of aluminum alloy materials used for vacuum chambers and various kinds of components such as electrodes disposed therein and reduction of contamination for products to be treated have further been demanded in order to cope with narrow rule of device design and increasing density of plasmas or more severe atmosphere to achieve the performance requested. For satisfying such demands, there have been proposed high purity aluminum (Al: 99.9 wt % or higher) or an aluminum alloy with addition of Si and Mg in high purity aluminum in which the sum of other impurities is restricted to 0.1% or less as described in Japanese Patent Laid-Open Publication Hei 10-88271 as materials for the substrates to be applied with anodization.

However, in the materials comprising substrates made of aluminum alloys and applied with anodization, contamination caused by the anodized film per se can be reduced to some extent, but a difference of expansion due to the difference of the thermal expansion coefficient between the substrate aluminum alloy and the anodized film can not be relieved to result in crackings in the anodized film and develop corrosion along crackings thus formed in corrosive gas and plasma circumstances at high temperature of 200° C. or higher. This not only shortens each part or the material's life but also results in formation of particles to cause contamination for the products to be processed in plasma processing. When heater blocks and the like are formed by using existent Al alloys, the following problems are further present. That is, since the Al—Mg series alloys are not applicable for wide range of condition for the brazing property, special low temperature brazing materials have to be used upon bonding between the surface plate and the block main body, which disadvantageously increases the cost. Further, since the Al—Mg alloys have low heat conductivity, the surface temperature distribution on the heater blocks tends to become not uniform.

OBJECT OF THE INVENTION

This invention has been accomplished in view of the foregoing problems and intends to provide a chamber material made of aluminum alloy excellent in thermal cracking resistance and chemical and/or physical corrosion resistance in a high temperature corrosive circumstance and capable of reducing contamination excellently with having anodized film, as well as also excellent in brazing property.

Materials for the chambers in this invention include not only the structural materials for vacuum chambers used in semiconductor production apparatus but also include those materials for clampers, shower heads, susceptors, upper electrodes, lower electrodes, gas diffusion plates, heater blocks, pedestals, substrates for chucks, shower plates, diffusers, face plates, liner earth or earth electrodes. That is, they include, among those components disposed in the vacuum chambers or reactors, all of components that can be made of aluminum or aluminum alloys. In the subsequent descriptions, all of such materials are collectively referred to as chamber materials.

SUMMARY OF THE INVENTION

A chamber material made of Al alloy according to this invention is applied with an anodized film in which a substrate has a composition comprising, on the mass % basis, 0.1 to 2.0% Si, 0.1 to 3.5% Mg, 0.02 to 4.0% Cu and the balance of Al as the essential ingredient, as well as other impurity elements in which Cr is less than 0.04% in the impurity elements described above (hereinafter % means mass % unless otherwise specified).

According to this invention, precipitates ($Mg_2Si$) are precipitated by aging by the incorporation of Si and Mg in predetermined amount, Cu is concentrated at the periphery of $Mg_2Si$ and, when anodization is applied in this state, it is considered that sufficient spaces so called secondary pores to relieve the difference of the thermal expansion coefficient are formed at cell triplet points in the anodized film. This can suppress and prevent occurrence of crackings in the anodized film in a elevated temperature circumstance, so that the anodized film can develop inherent corrosion resistance, and thermal cracking resistance and corrosion resistance are excellent. Further, since corrosion caused by the crackings due to heat expansion difference is prevented, contamination due to corrosion products can be suppressed and prevented. Then, by restricting Cr in the impurity elements to less than 0.04%, the amount of impurity elements in the anodized film can be decreased by which contamination caused by the films per se can be suppressed to attain excellent reduction of the contamination. Further, in this invention, it is preferred to restrict Fe to 0.1% or less and Mn to 0.04% or less and, further, to restrict the sum for the impurity elements other than Fe, Cr, Mn to 0.1% or less among the impurity elements. This can realize excellent reduction of contamination. At the same time, this can be achieved to obtain physical stability in anodized film since there was less interruption for forming the anodized film in this materials state.

The chamber material according to this invention is used for plasma processing apparatus for applying predetermined processings to products to be processed by plasmas or active species obtained by conversion into plasmas in a chamber and the chamber material preferably has an anodized film at a portion exposed in the plasmas.

When the chamber material according to this invention is used for the plasma processing apparatus, since the material has excellent thermal cracking resistance and corrosion resistance in an atmosphere of high temperature corrosive gases and plasmas in the chamber and contamination due to impurity elements caused by the anodized film per se can also be decreased, excellent reduction of contamination to the material to be processed can be realized and the production yield is improved.

Further, the chamber material made of Al alloy according to this invention is to be disposed in a plasma processing apparatus for applying predetermined processing to the products to be processed by plasmas or active species obtained by conversion into plasmas in a chamber in which the chamber material has a composition comprising 0.2 to 0.6% Si, 0.45 to 0.9% Mg, 0.02 to 4.0% Cu and the balance of Al as the essential ingredient, as well as comprising other impurity elements.

When the contents for Cu, Si and Mg are controlled as described above, precipitates ($Mg_2Si$) are precipitated by aging and Cu is concentrated at the periphery of the precipitates, which is advantageous as the chamber material made of Al alloy used in a case of applying the plasma processing.

Further, when the chamber material according to this invention is used as a heater block having, at the inside, a heating member for heating a position of carrying products to be processed as a heater block, inexpensive and general-purpose brazing materials can be used when the block main body and the surface plate are brazed by using a brazing material, and it is possible to prevent evaporation of Mg at high vapor pressure that may constitute a contamination source.

Further, when the chamber material according to this invention is used as a carrier plate disposed detachably by way of engaging members to a position of a heater block main body for carrying products to be processed, it is possible to always put the carrying surface for the products to be processed liable to be damaged always in an appropriate state.

Then, it is preferred for such a constitution as having the anodized film at a position of the heater block exposed in the plasmas. Excellent corrosion resistance and reduction of contamination are provided with such a constitution.

PREFERRED EMBODIMENT OF THE INVENTION

The present inventors have made an earnest study for attaining chamber materials made of Al alloy having an anodized film, excellent in thermal cracking resistance, chemical and/or physical corrosion resistance, and capable of reducing contamination in a corrosive circumstance at a temperature from room temperature to elevated temperature of 2000 or higher and, as a result, have found a correlation between ingredient of additive elements in the aluminum alloy forming a substrate and the corrosion resistance of the anodized film and have found Si, Mg and Cu as the ingredients of additive elements that form a highly corrosion resistant anodized film.

That is, a material having an anodized film formed on a substrate of an aluminum alloy only with addition of Si and Mg, or an aluminum material at high purity such as JIS A 1000 series can not develop the corrosion resistance inherent to the anodized film to form particles of corrosion products since thermal crackings occur to the anodized film in corrosive gas circumstance at a temperature from room temperature to 200° C. or higher and corrosion occurs to the substrate by the invasion of the corrosive gas easily penetrated to the substrate Al alloy through the crackings. Then, it has been found that addition of Cu in an appropriate amount in addition to Si and Mg can prevent crackings in the anodized film and, accordingly, prevent the corrosive gas from contact to the substrate, so that excellent corrosion resistance at elevated temperature can be developed and, therefore, formation of particles can be suppressed.

The mechanisms that Mg, Si and Cu present in the substrate provide an effect of corrosion resistance for the anodized film have now been under study and it has been found that sufficient spaces so called secondary pores to relieve the difference of thermal expansion coefficient are formed at the cell triple points in the film by applying anodization in a state where Cu is concentrated at the periphery of $Mg_2Si$ precipitating in the substrate. Further, it is considered that the elements Mg, Si and Cu give an effect of providing individual cells per se formed upon anodization with resistance to thermal crackings.

Further, as a result of an earnest study on the content of the element in the aluminum alloy, it has been found that desired thermal cracking resistance, corrosion resistance and reduced contamination can be provided by using, as a substrate, an aluminum alloy of a composition comprising 0.1 to 2.1% Si, 0.1 to 3.5% Mg and 0.02 to 4.0% Cu as the essential ingredient and other impurity elements with Cr in the impurity elements being less than 0.04%, and forming an anodized film thereon. Accordingly, when the content of Fe and Mn as the impurity elements is reduced in order to reduce the contamination caused by the film per se, at the same time, this can be achieved to obtain physical stability in anodized film since there was less interruption for forming the anodized film in this materials state, this does not degrade the corrosion resistance in chemical and in physical.

This invention has been accomplished based on the foregoing findings and the reason for defining the ingredients of the Al alloy as the substrate for the chamber material made of Al alloy according to this invention is to be explained at first.

Si: 0.1–2.0%, Mg: 0.1–3.5%

Si and Mg are elements necessary for precipitating $Mg_2Si$ precipitates by aging. If Si is less than 0.1% and Mg is less than 0.1%, since precipitates $Mg_2Si$ are scarcely formed, spaces so called secondary pores enough to relieve thermal expansion can not be formed at the cell triplet points. On the other hand, if Si is more than 2.0% and Mg is more than 3.5%, macro crystals, for example, $Mg_2Si$ and $Al_mMg_n$ ($Al_3Mg_2$, $Al_{12}Mg_{17}$) and macro Si precipitation phase are formed, which remain as defects in the anodized film to deteriorate the corrosion resistance.

Cu: 0.02–4.0%

Cu has an effect of forming enough spaces to relieve difference of the thermal expansion coefficient at cell triplet points in the anodized film, when anodization is applied in a state where Cu is concentrated at the periphery of $Mg_2Si$. Such effect is insufficient if Cu is less than 0.02% and, on the other hand, growing of the film is inhibited greatly to take much time for the treatment if Cu exceeds 4.0%. Further, the film is dissolved in the electrolyte during long time treatment making the properties of the film not uniform. Therefore, the lower limit of Cu is defined as 0.02% and, preferably, 0.1%, while the upper limit is defined as 4.0%, preferably, 0.15%.

Cr: less than 0.04%

The aluminum alloy according to this invention comprises Si, Mg, Cu and the balance of Al as the essential ingredient, as well as other impurities. When the heavy metal Cr as the impurity element takes the position of the substitution type impurity in the material to be treated such as a wafer, this brings about characteristic failure of a semiconductor device such as increase of junction leak current, so that Cr is defined as less than 0.04%. This can suppress the amount of contamination caused by the anodized film per se, suppress the characteristics failure of the semiconductor device and improve the production yield.

Further, presence of heavy metals such as Fe and Mn as the impurity elements also gives an undesired effect of contamination to the material to be treated, Fe and Mn are preferably restricted to 0.1% or less and 0.04% or less, respectively. This can further suppress the amount of contamination caused by the anodized film per se.

In addition to Fe, Cr and Mn described above, presence of impurity elements such as Ni, Zn, Ti, B, Ca, Na and K may sometimes give an effect of contamination on the material to be treated, so that the some of such impurity element is preferably restricted to 0.1% or less with a view point of reducing the contamination.

Then, the reason for defining the ingredients of the Al alloy for the chamber material made of Al alloy, particularly, when it is used as a heater block or the like requiring brazing is to be explained next.

Si: 0.2–0.6%, Mg: 0.45–0.9%

Both Si and Mg precipitate as $Mg_2Si$ by artificial aging at high temperature to improve the strength. When Si is less than 0.2% and Mg is less than 0.45%, no necessary strength can be obtained. On the contrary, when Si is more than 0.6% and Mg is more than 0.9%, the solidus line temperature is lowered to decrease the difference relative to the liquidus line temperature of a brazing material and the aluminum alloy is also melted, making it difficult for brazing. Further, when Mg is more than 0.9%, Mg is evaporated and it contaminates a material to be treated in a plasma processing apparatus (for example, wafer). Particularly, since Mg is an metal element, it causes erroneous operation of integrated circuits formed on the Si wafer. The amount of Mg gas in the released gas can be decreased by restricting the content in the alloy as 0.45 to 0.9%.

Cu: 0.02–0.4%

Cu precipitates by solid solution hardening and formation of a compound phase with Al thereby improving the strength, as well as has an effect of nucleation for the precipitation of other alloying elements to promote precipitation hardening. Further Cu, in a predetermined range, is concentrated at the periphery of $Mg_2Si$, so that it has an effect of improving the thermal cracking resistance of the anodized film. If Cu is less than 0.02%, thermal crackings occur when the anodized film is formed. On the contrary, if the Cu content is more than 0.4%, the solidus line temperature is lowered to decrease the difference with respect to the liquidus line temperature of the brazing material and the aluminum alloy is also melted, making it difficult for brazing.

The chamber material made of Al alloy according to this invention may be prepared by subjecting an aluminum alloy material obtained by appropriate plastic fabrication of Al alloy ingot, for example, by forging or extrusion to solution treatment and aging treatment and then applying machining to an appropriate shape, or molding and fabricating the aluminum alloy material to a predetermined shape and then applying solution treatment and aging treatment.

The solution treatment and aging treatment can be conducted under the conditions, for example, at 515–550° C. for the solution treatment, water cooling and 170° C.×8 hr, 155–165° C.×18 hr for aging treatment as in usual T6 treatment.

In the chamber material made of Al alloy according to this invention, an anodized film of excellent thermal cracking resistance and corrosion resistance is formed on the surface of a substrate by applying anodization to the substrate described above.

The method of forming the anodized film can be conducted by properly selecting conditions for electrolysis, that is, composition and concentration for electrolyte and electrolysis conditions (voltage, current density, current-voltage waveform). For the anodization, electrolysis has to be conducted in a solution containing one or more of elements selected from C, S, N, P and B and it is effective to conduct electrolysis by using an aqueous solution containing one or more of substances selected from oxalic acid, formic acid, sulfamic acid, phosphoric acid, phosphorous acid, boric acid, nitric acid or compounds thereof, phthalic acid or compound thereof. There is no particular restriction on the thickness of the anodized film and it is about 0.1 to 200 $\mu$m, preferably, about 0.5 to 70 $\mu$m and, more preferably, about 1 to 50 $\mu$m.

The aluminum alloy material described above is suitable to various applications used in a corrosive atmosphere at high temperature and it is used particularly suitably to vacuum chambers used in plasma processing apparatus appended to semiconductor production facilities which are exposed to corrosive gases, plasmas or active species formed by conversion into plasmas in a high temperature circumstance, and which are required, on the other hand, to cause less contamination to products to be processed, as well as those components disposed in the inside thereof such as electrodes, for example, heater blocks.

DESCRIPTION OF THE ACCOMPANYING DRAWINGS

FIG. 1 is a schematic view showing a cross sectional shape of a heater block according to this invention.

Then, description is to be made to an example of applying a vacuum chamber material made of Al alloy to a heater block with reference to FIG. 1. FIG. 1 is a schematic cross sectional view of a heater block 1. As shown in FIG. 1, the heater block 1 disposed in a plasma processing apparatus A comprises a carrier plate 2 for placing a work W such as a wafer as a product to be treated, a surface plate 3 for supporting the plate 2 detachably by using retaining screws 8 as engaging members and a block body 4 for supporting the lower surface of the surface plate 3 at the circumferential edges.

Then, the block body 4 comprises a cover body 5 attached so as to support the lower surface of the surface plate 3 at the circumferential edge, a heater plate 6 disposed in contact with the lower surface of the surface plate 3 and a heater body (heating means (heater)) 7 for heating the work W. Then, the surface plate 3 and the cover body 5 are joined by welding such as electron beam, TIG (Tungsten Inert Gas) and MIG (Metal Inert Gas), while the surface plate 3 and the heater plate 6 are joined by brazing material.

The brazing material used for the heater block 1 is preferably such a material as less evaporizable even in a circumstance for conducting plasma processing and giving no undesired effect on the work to be processed and comprising, for example, alloy No. 445 according to JIS Z 3263.

As described above, in the heater block 1, since an anodized film is formed on the surface of the substrate aluminum alloy and a general-purpose brazing material with less effects of contamination to the work W can be used, the work W can be heated uniformly even when used in a state of applying plasma processing, and the effect of contamination on the work can be minimized.

In the illustrated embodiment, the heat block 1 comprises the carrier plate 2, the surface plate 3, the cover body 5 and the heater plate 6 but it may be constituted as below. That is, the constitution of the heater block is not particularly restricted and, for example, the heater block may be constituted with a block body integrally formed from a cover body and a heater plate, a surface plate and a carrier plate. Further, it may be comprised of a block body formed integrally from a cover body, a heater plate and a surface plate, and a carrying plate. Further, the heater block may comprises a block body in which heating means for heating the position carrying the product to be processed is disposed at the inside (a constitution in which the surface plate and the carrier plate are not used, the upper surface position of the block body also serves as a surface plate and the carrier plate and the heater plate is disposed in the inside).

Then, the engaging means may be such that the carrier plate is detachably disposed to the surface plate by threading engagement and the constitution is not particularly restricted. Furthermore, the thickness and the shape for each of the members are not particularly restricted so long as the purpose and the effect of the invention can be attained.

Further, even when the constitution of the heater block is different as described above, the anodized film is disposed to the position for each of the constituent parts (surface plate, block body, etc) exposed to plasmas when the heater block is used in the plasma processing apparatus.

This invention is further explained specifically by way of examples but it should be understood that the invention is not restricted to such examples.

EXAMPLE

Example 1

Aluminum alloys having compositions described in the following Table 1 were prepared by melting, ingots obtained by casting were cut, surface-scraped and then subjected to a soaking treatment. After the soaking treatment, materials each of 45 mm thickness were rolled to 4 mm thickness by hot rolling, applied with a solution treatment and then with usual T6 treatment to obtain tested alloy plates. Test specimens each sized 35×25 mm were sampled from the alloy plates, subjected to surface scraping and then applied with anodization. The treating solution and the electrolysis voltage used in the anodization are shown in Table 1. The temperature of the treating solution was kept at a room temperature and they were treated till a predetermined thickness was obtained.

For the evaluation of thermal cracking resistance and gas corrosion resistance of the specimens prepared as described above, ① a thermal cracking resistance test of repeating heating/cooling cycle from room temperature to 250° C. by five cycles and ② a halogen gas corrosion resistance test of keeping the specimens in a 5% chlorine-argon gas mixture at 300° C. for 3 hr were conducted, and the thermal cracking resistance and the gas corrosion resistance of the anodized film in heat cycle and corrosive circumstance were evaluated based on the following criteria.
① Evaluation Criteria for Thermal Cracking Resistance
◎: no cracking
○: cracking length of less than 80 mm/10 cm$^2$
Δ: cracking length of 80 mm/10 cm$^2$ or more—less than 160 mm/10 cm$^2$
×: cracking length of 160 mm/10 cm$^2$ or more
② Evaluation Criteria for Gas Corrosion Resistance
◎: no corrosion
○: corrosion area ratio of less than 10%
Δ: corrosion area ratio of 10% or more and less than 20%
×: corrosion area ratio of 20% or more Further, for specimens Nos. 16–23, the film forming rate was measured and the anodizability (anodization property) due to the difference of the Cu content was evaluated based on the following criteria.
Evaluation Criteria for Anodizability
○: 20 μm/hr or more
Δ: 8 μm/hr or more, less than 20 μm/hr
×: less than 8 μm/hr The results of evaluation for the thermal cracking resistance, gas corrosion resistance and anodizability are collectively shown in Table 1. The aluminum alloy of specimen No. 5 in Table 1 corresponds to commercial JIS A 6061 aluminum alloy.

As can be seen from Table 1, thermal cracking resistance, gas corrosion resistance and anodizability were obtained for the specimens in which the content for Si, Mg, Cu can satisfy the conditions of the invention (Nos. 1–10, Nos. 18–22). On the other hand, in No. 23 with the Cu content exceeding the range of the invention showed favorable thermal cracking resistance and gas corrosion resistance but the anodizability was degraded greatly.

TABLE 1

| Specimen No. | Alloy ingredient (wt %) | | | Impurity element (wt %) | | | | Anodized film | | | | Thermal | | Evaluation | | |
|---|---|---|---|---|---|---|---|---|---|---|---|---|---|---|---|---|
| | | | | | | | | Electrolytic solution Kind: Total for others | Concentration (g/l) | Voltage (V) | Thickness (μm) | Crack Resistance | Gas corrosion resistance | Anodizability | to contamination | Remark |
| | Si | Mg | Cu | Fe | Cr | Mn | | | | | | | | | | |
| 1 | 0.57 | 0.55 | 0.12 | 0.012 | <0.005 | <0.005 | 0.04 | Oxalic acid: | 30 | 80 | 20 | ◎ | ◎ | Not investigated | ◎ | |

TABLE 1-continued

| Specimen No. | Alloy ingredient (wt %) | | | Impurity element (wt %) | | | Total for others | Anodized film | | | | Thermal | | Evaluation | | Remark |
|---|---|---|---|---|---|---|---|---|---|---|---|---|---|---|---|---|
| | Si | Mg | Cu | Fe | Cr | Mn | | Electrolytic solution Kind: Concentration (g/l) | Voltage (V) | Thickness (μm) | | Crack Resistance | Gas corrosion resistance | Anodizability | Evaluation to contamination | |
| 2 | 0.61 | 0.99 | 0.04 | 0.012 | <0.005 | <0.005 | 0.03 | Oxalic acid: 30 | 80 | 20 | | ○ | ○ | Not investigated | ◎ | |
| 3 | 0.63 | 0.95 | 0.11 | 0.03 | 0.018 | 0.02 | 0.12 | Oxalic acid: 30 | 80 | 20 | | ◎ | ◎ | Not investigated | ◎ | |
| 4 | 1.0 | 0.8 | 0.1 | 0.09 | 0.035 | 0.037 | 0.15 | Oxalic acid: 30 | 80 | 20 | | ◎ | ◎ | Not investigated | ○ | |
| 5 | 0.74 | 0.95 | 0.31 | 0.35 | 0.087 | 0.11 | 0.14 | Oxalic acid: 30 | 80 | 20 | | ◎ | ◎ | Not investigated | Δ | |
| 6 | 0.8 | 09 | 0.2 | 0.15 | 0.05 | 0.05 | 0.08 | Oxalic acid: 30 | 80 | 20 | | ◎ | ◎ | Not investigated | Δ | |
| 7 | 1.4 | 2.0 | 0.4 | 0.2 | 0.01 | 0.01 | 0.05 | Oxalic acid: 30 | 80 | 20 | | ◎ | ◎ | Not investigated | Δ | |
| 8 | 0.4 | 0.7 | 0.05 | 0.04 | 0.03 | 0.02 | 0.1 | Sulfuric acid: 150 | 15 | 50 | | ○ | ○ | Not investigated | Not investigated | |
| 9 | 0.1 | 0.2 | 0.8 | 0.015 | <0.005 | <0.005 | 0.03 | Phosphoric acid: 30 | 80 | 5 | | ◎ | ○ | Not investigated | Not investigated | |
| 10 | 1.5 | 2.5 | 1.5 | 0.03 | 0.02 | 0.02 | 0.05 | Oxalic acid: 30 Sulfuric acid: 2 | 50 | 13 | | ○ | ○ | Not investigated | Not investigated | |
| 11 | 0.6 | 0.75 | 0.01 | 0.015 | 0.01 | 0.008 | 0.03 | Oxalic acid: 30 | 80 | 20 | | X | Δ | Not investigated | Not investigated | Comp Example |
| 12 | 0.4 | 1.5 | <0.01 | 0.08 | 0.03 | 0.03 | 0.12 | Oxalic acid: 30 | 80 | 15 | | X | X | Not investigated | Not investigated | Comp Example |
| 13 | 0.05 | 0.05 | 01 | 0.05 | 0.032 | 0.02 | 0.08 | Oxalic acid: 30 Sulfuric acid: 2 | 50 | 15 | | X | X | Not investigated | Not investigated | Comp. Example |
| 14 | 1.0 | 0.01 | 0.1 | 0.04 | 0.012 | <0.005 | 0.04 | Oxalic acid: 30 | 80 | 18 | | X | X | Not investigated | Not investigated | Comp Example |
| 15 | 2.5 | 1.0 | 0.2 | 0.02 | <0.005 | <0.005 | 0.03 | Oxalic acid: 30 Sulfuric acid: 2 | 50 | 25 | | Δ | Δ | Not investigated | Not investigated | Comp Example |
| 16 | 0.6 | 1.0 | <0.01 | 0.012 | 0.01 | 0.01 | 0.03 | Oxalic acid. 30 | 80 | 20 | | X | X | ○ | Not investigated | Comp Example |
| 17 | 0.6 | 1.0 | 0.01 | 0.015 | 0.02 | 0.02 | 0.04 | Oxalic acid: 30 | 80 | 20 | | Δ | X | ○ | Not investigated | Comp Example |
| 18 | 0.6 | 1.0 | 0.02 | 0.02 | 0.012 | 0.01 | 0.05 | Oxalic acid: 30 | 80 | 20 | | ○ | ○ | ○ | Not investigated | |
| 19 | 0.6 | 1.0 | 0.1 | 0.01 | 0.015 | <0.005 | 0.11 | Oxalic acid. 30 | 80 | 20 | | ◎ | ◎ | ○ | Not investigated | |
| 20 | 0.6 | 1.0 | 05 | 0.02 | <0.005 | <0.005 | 0.08 | Oxalic acid: 30 | 80 | 20 | | ◎ | ◎ | ○ | Not investigated | |
| 21 | 0.6 | 1.0 | 2.0 | 0.012 | 0.013 | 0.01 | 0.04 | Oxalic acid: 30 | 80 | 20 | | ◎ | ◎ | Δ | Not investigated | |
| 22 | 0.6 | 1.0 | 4.0 | 0.01 | 0.014 | <0.005 | 0.12 | Oxalic acid: 30 | 80 | 20 | | ◎ | ◎ | Δ | Not investigated | |

TABLE 1-continued

| Spec-imen No. | Alloy ingredient (wt %) | | | Impurity element (wt %) | | | Total for others | Electro-lytic solution Kind: Concen-tration (g/l) | Voltage (V) | Thermal Thick-ness (μm) | Crack Resis-tance | Gas corrosion resistance | Anod-izability | Evaluation to contami-nation | Remark |
|---|---|---|---|---|---|---|---|---|---|---|---|---|---|---|---|
| | Si | Mg | Cu | Fe | Cr | Mn | | | | | | | | | |
| 23 | 0.6 | 1.0 | 6.0 | 0.01 | <0.005 | <0.005 | 0.05 | Oxalic acid. 30 | 80 | 20 | ◎ | ◎ | X | Not investi-gated | Comp Example |

Then, for the aluminum alloys of specimens No. 1–7, contamination in the substrate treatment in the plasma processing apparatus was examined. The vacuum chamber for the plasma processing apparatus was manufactured by preparing a thick aluminum alloy plate from a cast ingot by rolling and, applying a solution treatment and an aging treatment (T6), which was then machined into a substrate for the vacuum chamber having a processing chamber of ϕ270 mm×100 mm depth, and forming an anodized film of 20 μm thickness on the surface thereof under the same treating conditions as those shown in Table 1. An upper lid formed of $SiO_2$ glass was assembled in an airtight manner on an opening of the vacuum chamber, and a radio frequency generation antenna was disposed just above the upper lid. A substrate of 150 mmϕ (silicon wafer) was placed on an electrode plate provided in the inside of the vacuum chamber. The electrode plate was made of the same material as that for the vacuum chamber substrate, on which an anodized film of 20 μm was formed under the same conditions. Furthermore, the vacuum chamber had an exhaust pipe and a gas feed pipe formed in communication with the inside thereof.

In the plasma test, plasmas were generated under the following conditions, the substrates were subjected to corrosive gases and plasmas for 2 hr and then the total amount for Fe, Cr and Mn on the substrates were measured and the degree of contamination of the substrate was evaluated based on the following criteria.

Test Condition

Gas used: chlorine gas
Gas pressure: 10 mTorr
Gas flow rate: 100 sccm
RF power: ICP 100 W
RF generation time: 2 hr (test time)

Evaluation Criteria for Contamination of Substrate

Evaluation was made assuming the total amount as 100% for Fe, Cr and Mn on the substrate, plasma treated in a vacuum chamber using an aluminum alloy of specimen No. 5 (corresponding to commercial 6061 material) (standard chamber):

⊚: less than 50% of the standard chamber
○: 50% or more and less than 80% of the standard chamber
Δ: 80% or more and 95% or less of the standard chamber The results are collectively shown in Table 1. It can be seen from Table 1 that contamination was reduced in the substrates for Nos. 1–4, among aluminum alloys for specimen Nos. 1–7, where the amount of Fe, Cr and Mn was at a predetermined amount or less defined in this invention. For No. 4, since other impurities was somewhat as 0.15%, degree of contamination was somewhat higher compared with other. On the other hand, Nos. 5–7 in which any one of Fe, Cr and Mn exceeds the range of the this invention were in the thermal cracking resistance and gas corrosion resistance but inferior to the reduction of the contamination for the substrate compared with Nos. 1 to 4.

Example 2

Aluminum alloys having the compositions as described in Table 2 were prepared by melting and cast into block body portions each of a disk-like shape sized 260 ϕ×50 mm thickness by die casting, and plate-like test pieces each sized 40×25×5 mm were cut out of the cast aluminum alloys. Then, the cut-out test pieces were subjected to a soaking treatment at 540° C.×4 hrs and then applied with a test for the evaluation of brazed state, measurement for the surface temperature difference, amount of the released gas, the state of the anodized film after heating and the strength of the material as shown in Table 2.

TABLE 2

| Material | | Chemical ingredient (mass %) | | | | | |
|---|---|---|---|---|---|---|---|
| Section | Symbol | Cu | Si | Mg | Fe | Mn | Al |
| Example | A | 0.12 | 0.60 | 0.59 | 0.09 | 0.00 | Balance |
| | B | 0.38 | 0.55 | 0.84 | 0.05 | 0.00 | Balance |
| | C | 0.11 | 0.24 | 0.47 | 0.11 | 0.00 | Balance |
| | D | 0.02 | 0.57 | 0.55 | 0.01 | 0.00 | Balance |
| Comp. Example | E | 0.01 | 0.60 | 0.75 | 0.015 | 0.008 | Balance |
| | F | 0.48 | 0.42 | 0.65 | 0.06 | 0.00 | Balance |
| | G | 0.25 | 0.80 | 1.08 | 0.12 | 0.00 | Balance |
| | H | 0.24 | 0.13 | 0.30 | 0.11 | 0.00 | Balance |
| | I | 0.18 | 0.13 | 1.04 | 0.10 | 0.00 | Balance |
| | J | 0.13 | 0.51 | 0.32 | 0.05 | 0.00 | Balance |
| | K | 0.00 | 0.00 | 4.50 | 0.10 | 0.20 | Balance |

TABLE 3

| | Abbreviation | Material symbol | Brazing property | Surface temperature difference (° C.) | Released gas amount (450° C.) $10^{-5}$ Pa·m·s$^{-1}$ | Mg gas amount in released gas | Anodized film after heating | Strength MPa |
|---|---|---|---|---|---|---|---|---|
| Example | 1 | A | ○ | 2.8 | 2.1 | $2.2 \times 10^{-2}$ | ○ | 110 |
| | 2 | B | ○ | 3.6 | 2.5 | $2.9 \times 10^{-2}$ | ○ | 130 |
| | 3 | C | ○ | 1.9 | 2.8 | $2.3 \times 10^{-2}$ | ○ | 105 |
| | 4 | D | ○ | 2.3 | 2.1 | $2.2 \times 10^{-2}$ | ○ | 115 |
| Comp. | 5 | E | X | 2.7 | 2.6 | $2.9 \times 10^{-2}$ | X | 107 |
| Example | 6 | F | X | 3.2 | 2.5 | $3.0 \times 10^{-2}$ | ○ | 135 |
| | 7 | G | X | 4.5 | 2.3 | $2.8 \times 10^{-2}$ | ○ | 128 |
| | 8 | H | ○ | 1.6 | 2.8 | $2.5 \times 10^{-2}$ | ○ | 90 |
| | 9 | I | X | 2.9 | 3.7 | $4.1 \times 10^{-2}$ | ○ | 95 |
| | 10 | J | ○ | 2.0 | 1.9 | $2.0 \times 10^{-2}$ | ○ | 92 |
| | 11 | K | X | 9.6 | 8.7 | $48.4 \times 10^{-2}$ | X | 134 |

The evaluation method for the brazed state was conducted by usually alloy No. 4045 according to JIS Z 3263 as the brazing material and at a brazing temperature defined as the solidus line temperature for each material −15° C. Then, the joined surface after brazing was put to super sonic flaw detection and the portion where the echo intensity was 80% or more relative to the strength of a plate of an identical thickness was defined as not joined portions. Further, the state was indicated by "○" for a case where the area ratio of the not joined portion based on the entire joined area was 20% or less and by "×" where it was greater than 20%. In Table 2, where the brazed state is "×", heat conduction from the block body to the surface plate became not uniform to make the temperature distribution in the Si wafer (work W referred to FIG. 1) not uniform failing to obtain uniform treatment to the Si wafer.

The method of measuring the surface temperature difference was conducted by using an inserted block body of 25 mm thickness (refer to FIG. 1), supplying current to an internal heater such that the temperature of the thermocouple disposed at a position 5 mm depth form the surface of the block body was at 450° C. in a static atmospheric at 23° C. and the surface temperature of the block body was measured and measuring the surface temperature of the block body by a contact type thermometer.

Then, the difference between the highest temperature and the lowest temperature on the surface of the block body is defined as a surface temperature difference (ununiformity of surface temperature). As the temperature difference increases, the temperature distribution in the Si wafer (work W, refer to FIG. 1) was made not uniform failing to obtain uniform treatment applied to the Si wafer (deposited film). Therefore, the temperature difference was defined to 5° C. or lower as the measure for obtaining uniform treatment.

The amount of the released gas was measured by heating the specimen cut-out from the heater block in vacuum and measuring the amount of the released gas. The amount of the released gas was measured by using an ionizing vacuum gage according to JIS Z 8752.

Since the gas ingredient contains Mg, steams, etc. and as the amount of the released gas is increased, Si wafer (work W, FIG. 1) is contaminated. In order not to contaminate the Si wafer, the amount of the released gas was defined as $6.5 \times 10^{-5}$ Pa.m.s$^{-1}$ or less. The Mg ingredient in the released gas was determined by a mass analyzer.

For the anodized film after heating, the test specimen cut out of the block body was applied with an anodization and heated in atmospheric air at 500° C.×1 hr and then the surface of the test specimen was observed by using an optical microscope at a magnifying factor of 1000 and indicated as "○" for those with no crackings and "×" for those with crackings. If crackings are present in the test specimens, it may possibly cause crackings in the anodized film to form corrosion starting from the crackings during actual use at the elevated temperature, such as higher than 300° C., for example.

For the offset yield strength, test specimens for tensile test were cut out from the block body after brazing and the test specimens were subjected to a tensile test. In a case where offset yield the strength is 100 MPa or less, it may be a worry that the strength becomes insufficient during use by heating and the test specimens may be deformed by their own weight.

As shown in Table 2, Examples A, B, C and D are determined such that Cu (0.02 to 0.4 mass %), Si (0.2 to 0.6 mass %) and Mg (0.45 to 0.9 mass %) are defined each at a content within the specified range. While in Comparative Example E to K, the content for Cu, Si and Mg is set such that at least one of the contents is out of the specified value.

As can be seen from the examples in Table 3, when Cu, Si and Mg are within the range of the invention, they exhibit characteristic values superior to the setting value for all of evaluation items.

On the contrary, as can be seen also from the comparative examples, if the content of Cu is insufficient (E) or excessive (F), evaluation for the anodized film after heating and brazing property are insufficient. Further, when the content for Si and Mg is excessive (G) or insufficient (H), evaluation for the brazing property and evaluation for the offset yield strength are insufficient. Further, in a case where the Mg content is high (I), the evaluation for the brazing property and the offset yield strength is insufficient, while the offset yield strength is insufficient when the Mg content is low (J). In the case of the Al—Mg alloy (K), the evaluation is insufficient for any of the brazing property, surface temperature difference, the amount of released gas and anodized film after heating. As described above, when Cu, Si and Mg are out of the specified range, undesirable evaluation is found always in at least one of evaluation items.

The chamber material made of Al alloy according to this invention has an anodized film of excellent thermal cracking resistance and gas corrosion resistance and also ensures reduced contamination, and can be used suitably in elevated temperature with corrosive gas and plasma circumstance. Further, when required portions are brazed, general-purpose brazing materials adaptable in the plasma processing circumstance can be used, and can minimize undesired effects of the constituent aluminum alloys on the products to be processed also in the plasma circumstance.

What is claimed is:

1. A chamber material made of Al alloy having an anodized film in which portions other than the film of the material has a composition comprising, on a mass% basis:

Si: 0.1–2.0%,

Mg: 0.1–3.5% and

Cu: 0.02–4.0% and the balance of Al as the essential ingredients, as well as other impurity elements in which Cr is less than 0.04% and Fe is 0.1% or less.

2. A chamber material made of Al alloy as defined in claim 1, wherein

Mn is 0.04% or less on a mass% basis.

3. A chamber material made of Al alloy as defined in claim 2, wherein the total of the impurity elements other than Fe, Cr and Mn is 0.1% or less by mass %.

4. A chamber material as defined in claim 1, wherein the chamber material is used in a plasma processing apparatus for applying predetermined processing to products to be processed by plasmas or active species obtained by conversion into plasmas in the chamber and has an anodized film at a position exposed to plasmas.

5. A chamber material made of Al alloy which has a composition comprising, on a mass% basis:

Si: 0.2–0.6%,

Mg: 0.45–0.9%,

Cu: 0.02–4.0% and the balance of Al as the essential ingredients, as well as other impurity elements in which Fe is 0.1% or less.

6. A chamber material as defined in claim 5, wherein the chamber material is a heater block main body.

7. A chamber material as defined in claim 6, having an anodized film on the surface of the block body at a position exposed to plasmas by a plasma processing apparatus.

8. A chamber material as defined in claim 5, wherein the chamber material is a carrier plate disposed detachably by way of an engaging member to a block body at a position for carrying the product to be processed.

9. A chamber material as defined in claim 8, wherein the carrier plate has an anodized film at a position exposed in the plasmas by the plasma processing apparatus.

10. A heater block having a block body provided with an internal heating means for heating the position at which a product to be processed is carried, in which the block body comprises, on a mass% basis:

Si: 0.2–0.6%,

Mg: 0.45–0.9%,

Cu: 0.02–4.0% and the balance of Al as the essential ingredients, as well as other impurity elements in which Fe is 0.1% or less.

11. A heater block as defined in claim 10, having an anodized film at a position on the surface of the block body exposed in the plasmas by the plasma processing apparatus.

12. A plasma processing apparatus for applying predetermined processing to products to be processed by plasmas or active spaces obtained by conversion into plasmas in a chamber, wherein the chamber material is made of Al alloy having a composition comprising, on a mass% basis:

Si: 0.2–0.6%,

Mg: 0.45–0.9%,

Cu: 0.02–4.0% and the balance of Al as the essential ingredients, as well as other impurity elements in which Fe is 0.1% or less.

13. A plasma processing apparatus having a heater block disposed therein, wherein the heater block has a block body provided with an internal heating means for heating the position at which a product to be processed is carried, in which the block body comprises, on a mass% basis:

Si: 0.2–0.6%,

Mg: 0.45–0.9%,

Cu: 0.02–4.0% and the balance of Al as the essential ingredients, as well as other impurity elements in which Fe is 0.1% or less.

* * * * *